(12) United States Patent
Jin

(10) Patent No.: US 10,686,113 B2
(45) Date of Patent: Jun. 16, 2020

(54) POWER GENERATION BRICK

(71) Applicant: Chunsong Jin, Beijing (CN)

(72) Inventor: Chunsong Jin, Beijing (CN)

( * ) Notice: Subject to any disclaimer, the term of this patent is extended or adjusted under 35 U.S.C. 154(b) by 71 days.

(21) Appl. No.: 15/780,235

(22) PCT Filed: Nov. 28, 2016

(86) PCT No.: PCT/CN2016/107432
§ 371 (c)(1),
(2) Date: May 30, 2018

(87) PCT Pub. No.: WO2017/092633
PCT Pub. Date: Jun. 8, 2017

(65) Prior Publication Data
US 2018/0375007 A1 Dec. 27, 2018

(30) Foreign Application Priority Data
Dec. 1, 2015 (CN) .......................... 2015 1 0867050

(51) Int. Cl.
*H01L 35/02* (2006.01)
*H01L 35/30* (2006.01)
*E04C 1/39* (2006.01)
*H01L 35/32* (2006.01)

(52) U.S. Cl.
CPC ............... *H01L 35/30* (2013.01); *E04C 1/39* (2013.01); *H01L 35/32* (2013.01); *Y02B 10/20* (2013.01)

(58) Field of Classification Search
CPC ......... E01C 15/00; H01L 35/30; H01L 35/32; E04C 1/39
See application file for complete search history.

(56) References Cited

U.S. PATENT DOCUMENTS

| 4,326,012 A | 4/1982 | Charlton |
| 2013/0199592 A1* | 8/2013 | Hussain ................. H01L 35/32 136/206 |

FOREIGN PATENT DOCUMENTS

| CN | 202424590 U | 9/2012 |
| CN | 105332461 A | 2/2016 |
| CN | 205259431 U | 5/2016 |

* cited by examiner

*Primary Examiner* — Angelo Trivisonno
(74) *Attorney, Agent, or Firm* — Hauptman Ham, LLP

(57) ABSTRACT

A power generating brick comprising a brick body with a through hole provided along a vertical direction; a thermoelectric unit disposed in the through hole and comprising a heat collecting assembly, a thermoelectric power generation sheet and a heat sink; wherein, the heat sink is disposed at the lower end of the through hole; the thermoelectric power generation sheet is disposed on the heat sink; the heat collecting assembly is disposed on the thermoelectric power generation sheet; so as to generate electrical energy from a temperature difference between the cold and hot sides of the thermoelectric power generation sheet, and output electrical energy via wires connected to the positive and negative electrodes of the thermoelectric power generation sheet. The power generating brick can be laid on the pedestrian streets, squares, roads and roofs of a city or used as walls of a building. Converting the collected solar thermal energy into electrical energy by the power generating brick, the surrounding facilities can be supplied for electricity. Use of power generating brick reduces external clutter caused by wiring while reducing costs.

3 Claims, 2 Drawing Sheets

POWER GENERATION BRICK

RELATED APPLICATIONS

The present application is a National Phase of International Application Number PCT/CN2016/107432, filed Nov. 28, 2016, which claims priority to CN201510867050.4 filed Dec. 1, 2015.

FIELD OF THE INVENTION

The invention relates to the field of solar power generation, in particular to a power generating brick.

BACKGROUND OF THE INVENTION

As an important part of human energy use, solar energy not only does not pollute the environment, but also greatly reduces the cost, so it is gaining increasing concern. However, the use of solar energy is mainly in the aspects such as water heaters, and is subject to certain limitations. The place of residence requires a large amount of electric energy, but it has not been able to make full use of solar thermal energy.

SUMMARY OF THE INVENTION

It is an object of the invention to provide a power generating brick that is capable of converting solar energy into electrical energy.

The invention solves the technical problem by adopting the following technical solution: a power generating brick comprising a brick body with a through hole provided along a vertical direction;

a thermoelectric unit disposed in the through hole and comprising a heat collecting assembly, a thermoelectric power generation sheet and a heat sink;

wherein, the heat sink is disposed at the lower end of the through hole; the thermoelectric power generation sheet is disposed on the heat sink; the heat collecting assembly is disposed on the thermoelectric power generation sheet; so as to generates electrical energy from a temperature difference between the cold and hot sides of the thermoelectric power generation sheet, and output electrical energy via wires connected to the positive and negative electrodes of the thermoelectric power generation sheet.

Optionally, the power generating brick comprises a plurality of thermoelectric units connected therebetween in series or in parallel.

Optionally, the brick body is provided with two wire holes located on the same side of the brick body and the wires connecting the positive and negative electrodes of the thermoelectric power generation sheet are respectively located in the two wire holes.

Optionally, the heat collecting assembly comprises a heat collecting plate and a plurality of heat collecting fins, the heat collecting plate having a plate shape and being horizontally arranged, the lower surface of the heat collecting plate being in contact with the upper surface of the thermoelectric power generation sheet, and the plurality of heat collecting fins being vertically fixed on the upper surface of the heat collecting plate.

Optionally, the heat sink comprises a heat conduction shaft and a plurality of heat dissipation plates fixed thereto; the heat dissipation plate having, in the middle of the heat dissipation plate, a through hole through which the heat conduction shaft passes to allow the heat dissipation plate to be perpendicular to the heat conduction shaft.

Optionally, the heat dissipation plate comprises a first heat dissipation plate and a second heat dissipation plate, the first heat dissipation plate being located at a lower end of the heat conduction shaft; the second heat dissipation plate being located in the middle of the heat conduction shaft, and the two heat dissipation plates being parallel to each other; when the heat sink is fixed to the brick body, the brick body being provided with a groove for housing the first heat dissipation plate on the lower surface of the brick body and an accommodating space for housing the second heat dissipation plate in the interior of the brick body, such that the heat conduction shaft is located in the through hole; the second heat dissipation plate is located in the accommodating space, the first heat dissipation plate is located in the groove, and the lower surface of the first heat dissipation plate and the lower surface of the brick body are on the same plane.

The invention solves the technical problem by further adopting the following technical solution: a power generating brick comprising a brick body with a counterbore provided thereon along a vertical direction, and at the bottom wall of the counterbore a plurality of mounting holes being provided which match with heat dissipation fins;

a thermoelectric unit disposed in the counterbore and comprising a heat collecting assembly, a thermoelectric power generation sheet and a heat sink;

wherein, the heat sink is disposed at the lower end of the counterbore; the thermoelectric power generation sheet is disposed on the heat sink; the heat collecting assembly is disposed on the thermoelectric power generation sheet; so as to generates electrical energy from a temperature difference between the cold and hot sides of the thermoelectric power generation sheet, and output electrical energy via wires connected to the positive and negative electrodes of the thermoelectric power generation sheet.

Optionally, the power generating brick comprises a plurality of thermoelectric units connected therebetween in series or in parallel.

Optionally, wherein the brick body is provided with two wire holes located on the same side thereof and the wires connecting the positive and negative electrodes of the thermoelectric power generation sheet are respectively located in the two wire holes.

Optionally, the heat collecting assembly comprises a heat collecting plate and a plurality of heat collecting fins, the heat collecting plate having a plate shape and being horizontally arranged, the lower surface thereof being in contact with the upper surface of the thermoelectric power generation sheet, and the plurality of heat collecting fins being vertically fixed on the upper surface of the heat collecting plate.

Optionally, the heat sink comprises a substrate and a heat dissipation fin, the substrate having a circular plate-shape or a square plate-shape, and the upper surface of the substrate being in contact with the lower surface of the thermoelectric power generation sheet; the heat dissipation fin being in a column shape, the upper ends thereof being fixed on the lower surface of the substrate, and the length direction thereof being perpendicular to the substrate.

Optionally, the heat sink comprises a plurality of heat dissipation fins parallel to each other and disposed at equal intervals.

The invention has the following beneficial effects: the power generating brick provided by the invention can be laid on the pedestrian streets, squares, roads and roofs of a city or used as walls of a building. Converting the collected solar thermal energy into electrical energy by the power generating brick, the surrounding facilities can be supplied for electricity. Use of power generating brick reduces external clutter caused by wiring while reducing costs.

Figure 1:
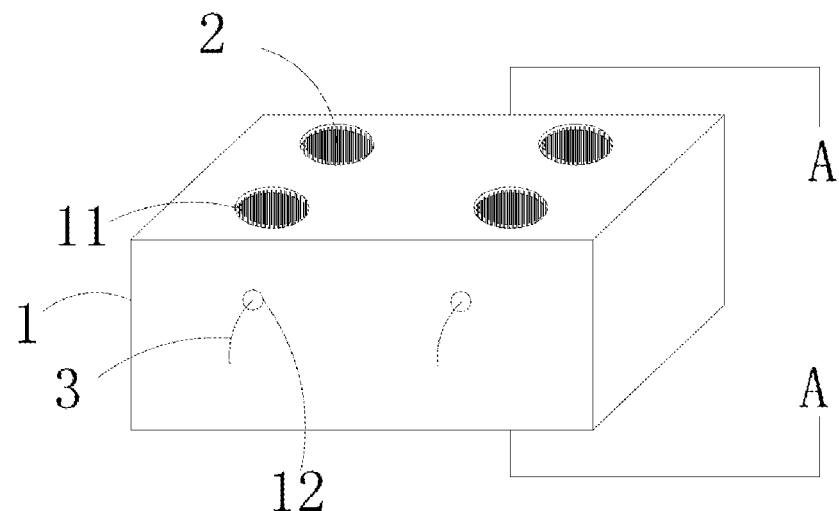
FIG. 1 is a schematic structural view of the power generating brick according to the invention.

The reference signs in the drawings are as follows:

1—brick body; 11—through hole; 12—wire hole; 2—thermoelectric unit; 21—heat collecting sheet; 22—thermoelectric power generation sheet; 23—heat sink; 231—substrate; 232—heat dissipation fin; 3—wire.

DETAILED DESCRIPTION OF THE PREFERRED EMBODIMENTS

The technical solutions of the invention are further described below in conjunction with the embodiments and the accompanying drawings.

Embodiment 1

Figure 2:
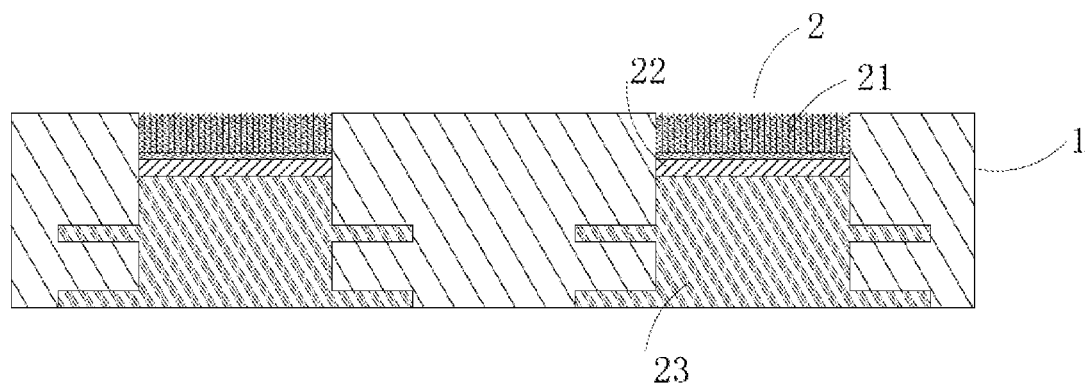
FIG. 2 is a sectional view of A-A in FIG. 1.

As shown in FIG. 1 and FIG. 2, in this embodiment, provided is a power generating brick, including a brick body 1 made of concrete which has a rectangular parallelepiped or cylindrical structure and may be in other shapes such as a hexagonal prism. The brick body 1 can have a height of 5-200 mm, and the power generating brick has the same height as that of the brick body 1 so that the power generating brick can be laid on the wall when its thickness is small, and can be laid on the road when its thickness is large.

A plurality of through holes are formed in the brick body 1 of the power generating brick in a vertical direction, and the upper openings of the through holes can be in a circular shape (refer to FIG. 1) or a rectangular shape (not shown). The cross-section of the through hole 11 along the plane passing through the centerline thereof is in a "±" shape.

A thermoelectric unit 2 is disposed in the through hole and fixed on the brick body 1. In this embodiment, the thermoelectric unit 2 includes a heat collecting element 21, a thermoelectric power generation sheet 22, and a heat sink 23.

The heat sink is disposed at a lower end of the through hole and is fixed in the through hole. In this embodiment, the heat sink includes a heat conduction shaft and a plurality of heat dissipation plates fixed thereto. In this embodiment, in the middle of the heat dissipation plate, provided is a through hole through which the heat conduction shaft passes such that the heat dissipation plate is perpendicular to the heat conduction shaft. More preferably, the number of the heat dissipation plate in this embodiment is two, namely a first and a second heat dissipation plates. One of the heat dissipation plates, namely, the first heat dissipation plate is located at the lower end of the heat conduction shaft, and the other, namely, the second heat dissipation plate is located in the middle of the heat conduction shaft. The two heat dissipation plates are parallel to each other.

When the heat sink is fixed to the brick body, the brick body is provided with a groove for housing the first heat dissipation plate on the lower surface of the brick body and an accommodating space for housing the second heat dissipation plate in the interior of the brick body, such that the heat conduction shaft is located in the through hole; the second heat dissipation plate is located in the accommodating space, the first heat dissipation plate is located in the groove, and the lower surface of the first heat dissipation plate and the lower surface of the brick body are on the same plane.

In this embodiment, the heat sink can be made of a material that is thermally conductive and not easily oxidized, for example, a metal material such as copper. Preferably, the heat conduction shaft of the heat sink and the two heat dissipation plates can be integrally formed, for example, by casting.

The thermoelectric power generation sheet 22 is disposed on the heat sink and located in the through hole. That is, the thermoelectric power generation sheet is disposed on a heat conduction shaft of the heat sink, and the cold side of the thermoelectric power generation sheet 22 and the upper end of the heat conduction shaft are in contact so that the lower surface (cold side) of the thermoelectric power generation sheet has substantially the same temperature as that of the heat sink. Namely, the temperature of the lower surface of the thermoelectric power generation sheet is kept lower than that of the upper surface (hot side) thereof by virtue of the heat sink, allowing the thermoelectric power generation sheet to generate power.

The heat collecting assembly 21 is disposed on the thermoelectric power generation sheet and located in the through hole. That is, the lower end of the heat collecting assembly 21 is in contact with the upper surface (hot side) of the thermoelectric power generation sheet, so as to collect solar heat via the heat collecting assembly 21 and transmit the heat to the upper surface (hot side) of the thermoelectric power generation sheet 22, allowing maintenance of a temperature difference between the cold and hot sides of the thermoelectric power generation sheet.

In this embodiment, the heat collecting assembly includes a heat collecting plate and a plurality of heat collecting fins. The heat collecting plate has a plate shape and is horizontally arranged. Its lower surface is in contact with the upper surface of the thermoelectric power generation sheet 22. The plurality of heat collecting fins are vertically fixed on the upper surface of the heat collecting plate, so that the solar energy is collected via the heat collecting fins, and the heat is transmitted to the thermoelectric power generation sheet via the heat collecting plates.

In this embodiment, the upper ends of the heat collecting fins are not on the same plane. Preferably, the upper ends of the heat collecting fins are on the same spherical surface, and the heat collecting fin in the middle is located lower than other heat collection fins.

In this embodiment, the heat collecting assembly 21, the thermoelectric power generation sheet 22 and the heat sink 23 are fixed mutually by a heat conductive sealing curing agent that can be a heat conductive silica gel.

The thermoelectric power generation sheet 22 in this embodiment is capable of converting thermal energy into electrical energy through the temperature difference between the hot and cold side thereof, and outputting the electrical energy through wires 3 connected to the positive and negative electrodes of the thermoelectric power generation sheet 22.

In order to output the electric energy generated by the thermoelectric power generation sheet to the outside of the brick body 1, on the sidewall of the brick body 1 provided is a wire hole 12, through which the wire 3 passes the brick body 1. Since the positive and negative wires connected to the thermoelectric power generation sheet 22 have different colors, the number of the wire hole 12 may be one or two, and is not limited herein.

In this embodiment, there can be a plurality of thermoelectric units 2, and the thermoelectric power generation sheets of the thermoelectric units 2 are connected in series or in parallel. In this case, the number of the through holes 11 on the brick body 1 is consistent with that of thermoelectric units 2.

The power generating brick provided in the present invention can be laid on the pedestrian streets, squares, roads, and roofs of a city, and can also be used as walls of buildings.

The specific operating principle is as follows. The heat collecting assembly 21 exposed to the sun collects solar heat energy, and then transmits the collected heat energy to the hot side of the thermoelectric power generation sheet 22 while heat is dissipated at the cold side of the thermoelectric power generation sheet 22 through the heat sink 23 at the bottom of the brick body 1. The thermoelectric power generation sheet 22 converts thermal energy into electrical energy by virtue of the temperature difference between the hot side and the cold side thereof, and is connected to the wire 3 on the adjacent power generating brick through the wire 3 to achieve power transmission. It can also provide power to the surrounding electrical facilities through the wire 3, allowing greatly reducing the complex wiring on the road, while reducing the cost of electricity and saving energy.

As can be seen from the above, the invention proposes inventively a power generating brick manufactured using a temperature power generation sheet, and there is no existing technique in the prior art for manufacturing a power generating brick using a temperature power generation sheet.

Embodiment 2

Figure 3:
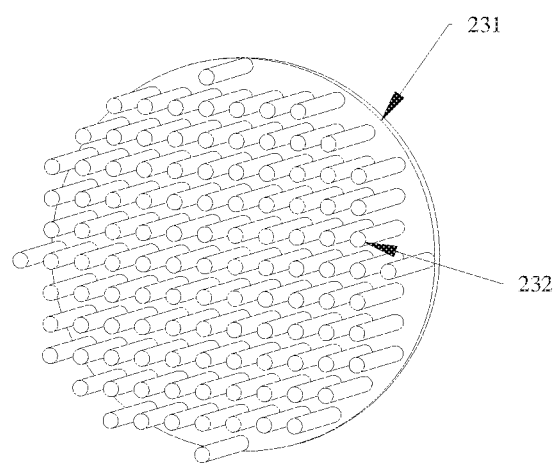
FIG. 3 is a schematic structural view of the heat sink in Example 2.
Figure 4:
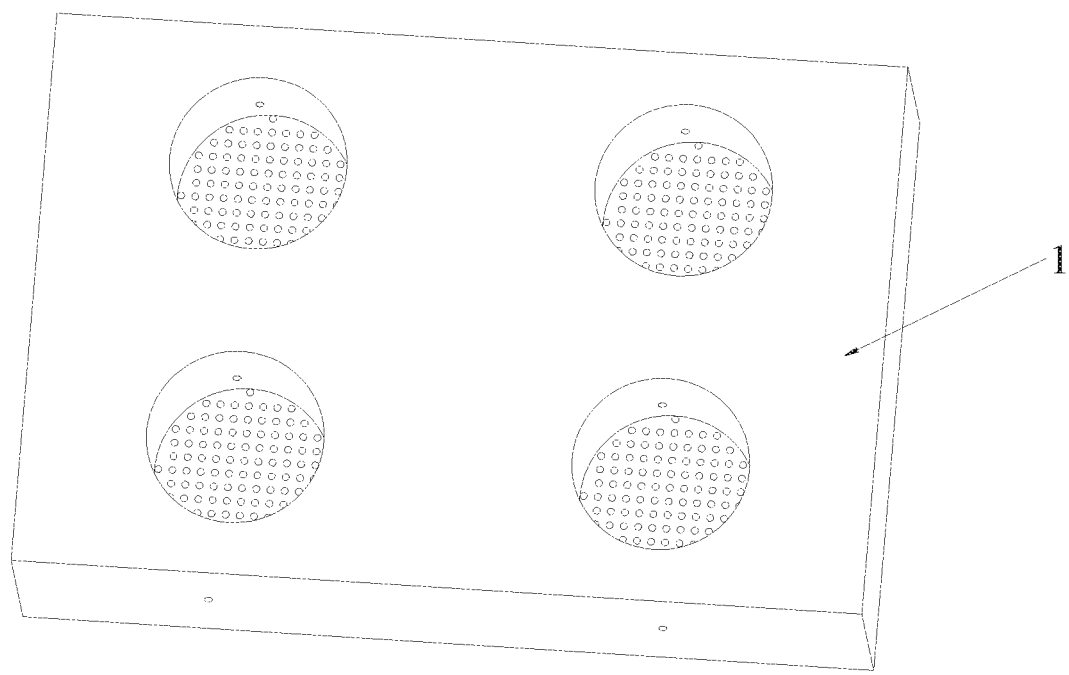
FIG. 4 is a schematic structural view of the brick body in Example 2.

As shown in FIG. 3 and FIG. 4, this embodiment provides a power generating brick, which is different from Embodiment 1 in the structure of the heat sink 23.

Specifically, the heat sink 23 can be made of a metal such as copper having good thermal conductivity, and include a substrate and heat dissipation fins. In this embodiment, the substrate has a circular plate-shape or a square plate-shape, and the upper surface thereof is in contact with the lower surface (cold side) of the thermoelectric power generating sheet 22, so that the lower surface (cold side) of the thermoelectric power generation sheet can have substantially the same temperature as that of the heat sink. Namely, the temperature of the lower surface of the thermoelectric power generation sheet is kept lower than that of the upper surface (hot side) thereof by virtue of the heat sink, allowing the thermoelectric power generation sheet to generate power.

The heat dissipation fins have a columnar shape and a cross-section that may be round or square. The upper ends of the heat dissipating fins are fixed on the lower surface of the substrate, and the length direction thereof is perpendicular to the substrate. In this embodiment, the heat dissipation fins can be integrally formed with the substrate, such as by casting.

In this embodiment, there are a plurality of heat dissipation fins that are parallel to each other and arranged in multiple rows and columns. In this embodiment, The row and column spacing between the heat dissipation fins and the adjacent one the same, namely, the heat dissipation fins are uniformly distributed on the lower surface of the substrate.

The heat dissipation fins are inserted into the brick body. In this case, the brick body has different structure from that in Embodiment 1. A plurality of counterbores are provided on the brick body 1 of the power generating brick in a vertical direction. The bottom walls of the counterbores are provided with a plurality of mounting holes matched with the heat dissipation fins. The heat dissipation fins of the heat sink are inserted into the mounting holes. The lower surface of the substrate of the heat sink is in contact with the bottom wall of the counterbores.

The order of the embodiments above is merely for convenience of description and does not represent the advantages or disadvantages of the embodiments.

Finally, it should be noted that the above embodiments are only described to illustrate the technical solutions of the present invention, rather than limiting the same. Although the present invention has been described in detail with reference to the foregoing embodiments, those of ordinary skill in the art should understand that the technical solutions described in the foregoing embodiments can be modified, or some of the technical features therein can be replaced equivalently. These modifications or replacements do not make the essence of the corresponding technical solutions depart from the spirit and scope of the technical solutions of embodiments of the present invention.

What is claimed is:

1. A power generating brick comprising:
a brick body with a through hole provided along a vertical direction;
a plurality of thermoelectric units disposed in the through hole and comprising a heat collecting assembly, a thermoelectric power generation sheet and a heat sink;
wherein:
the heat sink is disposed at the lower end of the through hole,
the thermoelectric power generation sheet is disposed on the heat sink,
the heat collecting assembly is disposed on the thermoelectric power generation sheet so as to generate electrical energy from a temperature difference between the cold and hot sides of the thermoelectric power generation sheet, and output electrical energy via wires connected to the positive and negative electrodes of the thermoelectric power generation sheet,
a plurality of thermoelectric units is connected therebetween in series or in parallel,
the brick body is provided with two wire holes located on a same side of the brick body and the wires connecting the positive and negative electrodes of the thermoelectric power generation sheet are respectively located in the two wire holes,
the heat collecting assembly comprises a heat collecting plate and a plurality of heat collecting fins, the heat collecting plate having a plate shape and being horizontally arranged, a lower surface of the heat collecting plate being in contact with an upper surface of the thermoelectric power generation sheet, and the plurality of heat collecting fins being vertically fixed on an upper surface of the heat collecting plate.

2. The power generating brick of claim 1, wherein:
the heat sink comprises a heat conduction shaft and a plurality of heat dissipation plates fixed to the heat conduction shaft,
the heat dissipation plate having, in the middle thereof, a through hole through which the heat conduction shaft passes to allow the heat dissipation plate to be perpendicular to the heat conduction shaft.

3. The power generating brick of claim 2, wherein:
the heat dissipation plate comprises a first heat dissipation plate and a second heat dissipation plate, the first heat dissipation plate being located at a lower end of the heat conduction shaft,
the second heat dissipation plate being located in the middle of the heat conduction shaft, and the two heat dissipation plates being parallel to each other,
when the heat sink is fixed to the brick body, the brick body being provided with a groove for housing the first heat dissipation plate on the lower surface of the brick body and an accommodating space for housing the second heat dissipation plate in the interior of the brick body, such that the heat conduction shaft is located in the through hole of the brick body,
the second heat dissipation plate is located in the accommodating space, the first heat dissipation plate is located in the groove, and the lower surface of the first heat dissipation plate and the lower surface of the brick body are on the same plane.

* * * * *